US 6,709,970 B1

(12) United States Patent
Park et al.

(10) Patent No.: US 6,709,970 B1
(45) Date of Patent: Mar. 23, 2004

(54) METHOD FOR CREATING A DAMASCENE INTERCONNECT USING A TWO-STEP ELECTROPLATING PROCESS

(75) Inventors: Chankeun Park, Seoul (KR); Sangrok Hah, Seoul (KR); Juhyuck Chung, Suwon (KR); Hongseong Son, Suwon (KR); Byunglyul Park, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/232,684

(22) Filed: Sep. 3, 2002

(51) Int. Cl.$^7$ ............................................. H01L 21/4763

(52) U.S. Cl. ..................... 438/620; 438/622; 438/626; 438/629

(58) Field of Search ................. 438/620, 622, 438/626, 627, 629

(56) References Cited

U.S. PATENT DOCUMENTS

| | | | | |
|---|---|---|---|---|
| 5,534,461 A | * | 7/1996 | Kuwajima | 438/687 |
| 6,028,362 A | * | 2/2000 | Omura | 257/774 |
| 6,121,141 A | * | 9/2000 | Woo et al. | 438/687 |
| 6,207,222 B1 | * | 3/2001 | Chen et al. | 427/97 |
| 6,221,765 B1 | | 4/2001 | Ueno | 438/653 |
| 6,242,349 B1 | | 6/2001 | Nogami et al. | 438/687 |
| 6,399,477 B2 | * | 6/2002 | Morozumi | 438/622 |
| 6,498,090 B2 | * | 12/2002 | Morozumi | 438/625 |

OTHER PUBLICATIONS

Reed–Hill, et al. Physical Metallurgy Principles, 3rd Ed., PWS–Kent Pub Co, Boston, 240–251 [1992].
Smith, D.L. Thin–Film Deposition, McGraw–Hlll, Inc., New York, pp. 185–200, [1997].
Wee, Y.J., et al, "Electromigration Reliability of Dual Damascene Copper Interconnect with Different IMD Structures", Proceedings of 2001 International Interconnect Technology Conference (IITC), pp. 260–262. [2001].
Oshima, T., et al, "Improvement of Thermal Stability of Via Resistance in Dual Damascene Copper Interconnection", Technical Digest of 2000 International Electronic Device Meeting, IEDM 00–123 thru 126 [2000].
Musaka, K., et al., "Thermal Stress and Reliability Characterization of Barriers for Cu Interconnects", Proceedings of 2001 International Interconnect Technology Conference (IITC), pp. 83–85, [2001].
Rhee, S–H., et al. "Characterization of Thermal Stresses of Cu/low–k Submicron Interconnect Structures", Proceedings of 2001 International Interconnect Technology Conference, (IITC), pp. 89–91, [2001].
Hallyday, D., et al., Fundamentals of Physics, $2^{nd}$ Ed., John–Wiley & Sons, Inc., New York, pp. 347–348, [1976].
Oring, M., The Materials Science of Thin Films, Academic Press, Inc., New York, pp. 551–552, [1992].

* cited by examiner

Primary Examiner—T. N. Quach
(74) Attorney, Agent, or Firm—Lee & Sterba, P.C.

(57) ABSTRACT

A method for forming void-free, low contact-resistance damascene interconnects during a manufacturing process of an integrated circuit having both narrow and deep openings and wide and shallow openings on a same substrate features a two-step copper (Cu) deposition process, with a high-temperature rapid annealing process being conducted after the first deposition. After forming in a top surface a narrow and deep opening and a wide and shallow opening, a first copper (Cu) layer is deposited on a seed layer using a small-grained Cu material to completely fill the narrow and deep opening. After annealing the first Cu layer to reduce stress on the resulting structure, a second layer of large-grained Cu material is deposited on the annealed first Cu layer to fill the remainder of the openings. The resulting assembly, which requires no additional annealing, is then planarized to the original surface.

22 Claims, 5 Drawing Sheets

METHOD FOR CREATING A DAMASCENE INTERCONNECT USING A TWO-STEP ELECTROPLATING PROCESS

BACKGROUND OF THE INVENTION

1. Field of the Invention

The present invention relates to a method for manufacturing a semiconductor device having copper elements, and more particularly to a method for creating damascene interconnects using dual-step electroplating and annealing process.

2. Description of the Related Art

In integrated semiconductor devices, the speed and performance characteristics of a gate are influenced by gate thickness and length. As the size of the gates are reduced in higher-density integrated circuits, a higher resistance results from a corresponding reduction in conductor size and, when coupled with an associated capacitance of a dielectric interlayer, can create significant signal propagation delays. To overcome such performance degradations, conventional aluminum conductors are being replaced with copper, which has a lower resistance than aluminum producing a resultant increase in gate speed.

The conductivity of copper is approximately twice that of aluminum and over three times that of tungsten. As a result, a same current can be carried through a copper line having half the width of an aluminum line, allowing for space-saving circuitry design. Also due to higher conductivity, copper consumes less power and, in addition, is less expensive than aluminum. Further, copper is approximately ten times less susceptible to degradation and breakage than aluminum and has superior electro-migration characteristics over those of aluminum. Thus, a copper line having a much smaller cross-section is better able to maintain electrical integrity than an aluminum line.

Disadvantageously, however, copper materially resists etching action of most conventional gaseous enchants, and thereby prevents fabrication of copper lines and copper plugs using conventional methods. Hence, a damascene process, and more particularly a two-step (dual-damascene) process, is usually employed. Such a process typically uses either a sputtering, electroplating, or CVD technique for metal-film deposition in the formation of copper lines and copper plugs.

Such techniques, however, involve complicated and expensive processing, since significant amounts of energy must be applied to a cupric metal compound to liberate or separate the copper from the metal compound for deposition on a surface where a semiconductor device is to be formed. Further, in a conventional sputtering process, deposition coverage may be inadequate due to the formation of voids. To overcome such problems, an electroplating process has been favored for the deposition of the copper layer.

A conventional manufacturing process for forming damascene copper interconnects in a semiconductor device will be described with reference to FIG. 1. An insulating film 2 is deposited on a silicon substrate 1, and then a via hole 5 is formed. A barrier-metal film 3, e.g., consisting of TiN at a thickness of 20 nm, is deposited by sputtering on the entire surface. A seed-metal film 4 for growing copper plating consisting of copper is then deposited via sputtering (FIG. 1(a)). A typical sputtering environment may comprise, for example, a substrate temperature of 0 degrees C., a sputter power of 2 KW, a pressure of 2 mTorr, and a distance between a target and the substrate of 60 mm.

The substrate is then electroplated by immersing it in an aqueous solution of cupric sulfate at ambient temperature. The electroplated substrate is removed from the solution and "self-annealed" for 50 to 80 hours at ambient temperature to stabilize the structure of copper plating film 7 as shown in FIG. 1(b). Following annealing, the substrate surface is polished by a chemical mechanical polishing (CMP) process to form damascene copper interconnects.

Disadvantageously, the aforementioned conventional manufacturing process has significant problems that can render a resultant semiconductor device unreliable. First, voids 6 may be generated inside a via hole or a groove due to the shrinkage of the thin copper plating during annealing as shown in FIG. 1(b). This prevents full contact area with the substrate of subsequent depositions. Second, small grains in a seed-metal film deposited when forming the electroplated layer remain after the self-annealing, and lead to a less reliable device. Finally, the lengthy time for the annealing step yields extremely low throughput for the manufacturing process.

SUMMARY OF THE INVENTION

According to a preferred embodiment according to the present invention, a first method of creating damascene interconnects in a semiconductor integrated device having narrow and deep openings and wide and shallow openings on a same substrate comprises depositing a plurality of layers on a semiconductor substrate to create an assembly having a top layer; forming a narrow and deep opening and a wide and shallow opening through at least two of the plurality of layers of the assembly; depositing a protective barrier film on exposed surfaces of the assembly; depositing a seed metal film on the protective barrier film; depositing a first metal film, such that the narrow and deep opening is completely filled; annealing the assembly having the first metal film; depositing a second metal film on the first metal film such that the wide and shallow opening is completely filled; and immediately thereafter planarizing the assembly to the top layer of the assembly.

The first and second metal films may be selected from the group consisting of copper film, gold film, and platinum film. The assembly is preferably annealed at a temperature between about 150 to about 300 degrees C. for a period of time between about 3 minutes to about 30 minutes. The first and the second metal film may be deposited using an electroplating process or an electroless plating process. The seed metal film may be deposited using a CVD process or a sputtering process. The top layer of the assembly may be planarized using a CMP process.

According to another embodiment of the present invention, there is provided a second method for creating damascene interconnects having narrow and deep openings and wide and shallow openings in a semiconductor integrated device according to the present invention, comprising depositing a plurality of layers on a semiconductor substrate to create an assembly having a top layer; forming a narrow and deep opening and a wide and shallow opening through at least two of the plurality of layers of the assembly; depositing a protective barrier film on exposed surfaces of the assembly; depositing a seed metal film on the protective barrier film; depositing a first metal film; such that the narrow and deep opening is completely filled; annealing the assembly having the first metal film; cleaning any metal oxide on the first metal film; depositing a second metal film on the first metal film, such that the wide and shallow opening is completely filled; and immediately thereafter, planarizing the assembly to the top layer of the assembly.

The cleaning of the metal oxide on the first metal film may be carried out by a reduction process using hydrogen-based plasma or by a chemical etching process, wherein the chemical may be selected from the group consisting of inorganic acids and organic acids, such as H, $H_2SO_4$ and HCl. The first and second metal films may be selected from the group consisting of copper film, gold film, and platinum film. The assembly is preferably annealed at a temperature between about 150 to about 300 degrees Centigrade for a period of time between about 3 minutes to about 30 minutes. The first and second metal film may be deposited using an electroplating process or an electroless plating process. The seed metal film may be deposited using a CVD process or a sputtering process. The top layer of the assembly may be planarized using a CMP process.

According to another embodiment of the present invention, there is provided a third method of creating damascene interconnects having narrow and deep openings and wide and shallow openings in a semiconductor integrated device, comprising depositing a plurality of layers on a semiconductor substrate to create an assembly having a top layer; forming a narrow and deep opening and a wide and shallow opening through at least two of the plurality of layers of the assembly; depositing a protective barrier film on exposed surfaces of the assembly; depositing a seed metal film on the protective barrier film; depositing a first metal film by an electroplating process using a copper acid solution, such that the narrow and deep opening is completely filled; annealing the assembly having the first metal film; cleaning any metal oxide on the first metal film by a chemical etching process using the copper acid solution; depositing a second metal film on the first metal film such that the wide and shallow opening is completely filled by an electroplating process using the copper acid solution; and immediately thereafter planarizing the assembly to the top layer of the assembly.

The copper acid solution may contain HCl and/or $H_2SO_4$. The step of cleaning any metal oxide on the first metal film is preferably conducted for a period between about 10 to about 60 seconds. The cleaning of any metal oxide on the first metal film by a chemical etching process using the copper acid solution and the depositing of a second metal film on the first metal film by an electroplating process using the copper acid solution may be conducted sequentially in a same treatment vessel. The assembly is preferably annealed at a temperature between about 150 to about 300 degrees Centigrade for a period of time between about 3 minutes to about 30 minutes. The seed metal film may be deposited using a CVD process or a sputtering process. The top layer of the assembly may be planarized using a CMP process.

These and other features of the present invention will be readily apparent to those of ordinary skill in the art upon review of the detailed description that follows.

DETAILED DESCRIPTION OF THE INVENTION

According to a preferred embodiment of the present invention, when using copper (Cu) as a filler metal for via holes or trenches (damascene interconnects) in the manufacture of an integrated circuit (IC) having narrow and deep openings and wide and shallow openings on a same substrate, connection reliability can be improved through the use of a dual-step Cu electroplating process. By preferably electroplating and annealing a thin (small-grained) first Cu layer on the integrated circuit in a first process, a uniform base can be created on the walls and bottom surfaces of such a cavity (i.e., without voids.) This first copper layer can be quickly annealed to form a stable and generally void-free structure that, after annealing, is compatible with a subsequent thicker (large-grained) Cu layer created in a next cavity-filling deposition process.

During the first deposition, any wide and shallow openings will typically be only partially filled by the first metal film, but will benefit from the deposition of the first metal layer with the attendant annealing step by having a lower contact resistivity. Such a dual-step process provides a more reliable metallic structure than that created using only a conventional single-step electroplating deposition process. It can be appreciated that although the discussion preferably uses copper as the conductive metal, other conductive metallic elements and compounds may be used with equal effect and are within the scope of the present invention.

FIGS. 2 through 9 illustrate the steps comprising the preferred method for manufacturing copper interconnects and plugs according to the present invention.

Figure 1A:
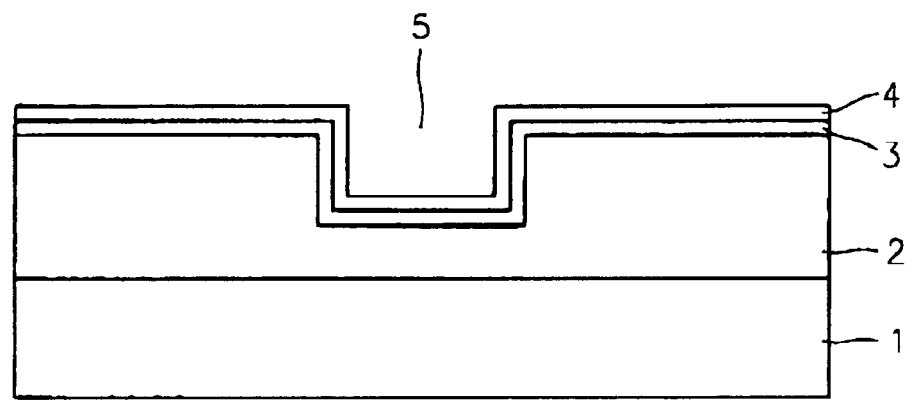
FIGS. 1A and 1B illustrate cross-sectional views of a conventional semiconductor integrated circuit (IC) according to a conventional manufacturing process for forming damascene copper interconnects.
Figure 1B:
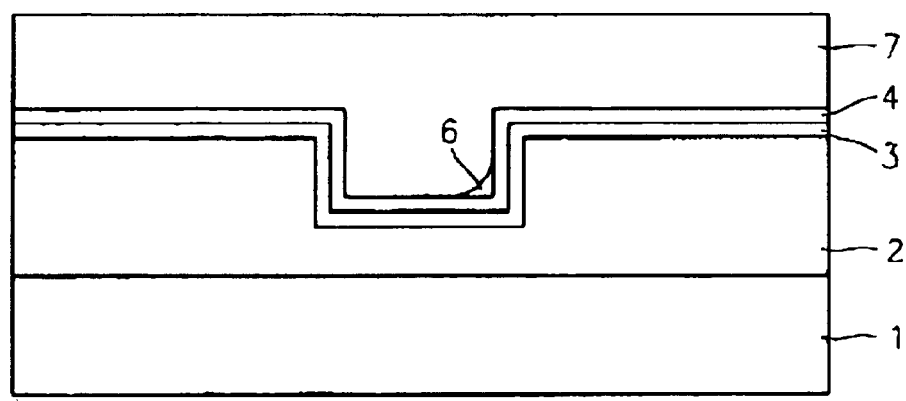
Figure 2:
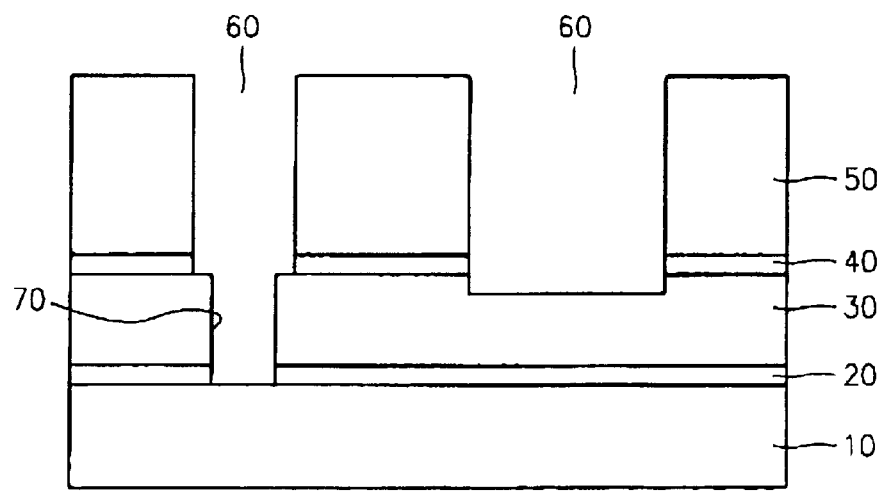
FIG. 2 illustrates a cross-sectional view of a semiconductor IC showing a via plug and trench cavities that have been etched in deposited layers of the semiconductor IC in accordance with the present invention.

Referring to FIG. 2, a semiconductor IC is shown having damascene openings, which preferably include on a same substrate 10 both 1) a narrow and deep cavity which includes via hole 70 in communication with a trench 60 as shown on the left side of FIG. 2, and 2) a wide and shallow trench cavity 60 as shown on the right side of FIG. 2, that have been etched in a conventional manner in previously deposited layers of insulating films 20, 30, 40, 50 of the IC in preparation for a first step of the dual-step electroplating process according to a preferred embodiment of the present invention. The via hole 70 in communication with the associated overlaying trench 60 comprises a dual damascene opening.

The insulating films 30 and 50 are used for forming vias and interconnects, and the insulating films 20 and 40 are layers to stop etching of the insulating films 30 and 50 during the dual damascene etch process.

The insulating films 20 and 40 may include one or more compounds from the group consisting of SiN and SiC, while insulating films 30 and 50 may include one or more compounds from the group consisting of TEOS, FSGA SiOC and SiLK.

To prepare for the first coating of Cu in these cavities, the cavities are preferably coated with intermediate layers or films to prevent interaction with existing layers and to provide a molecularly compatible surface for the deposition of the copper filler material.

Figure 3:
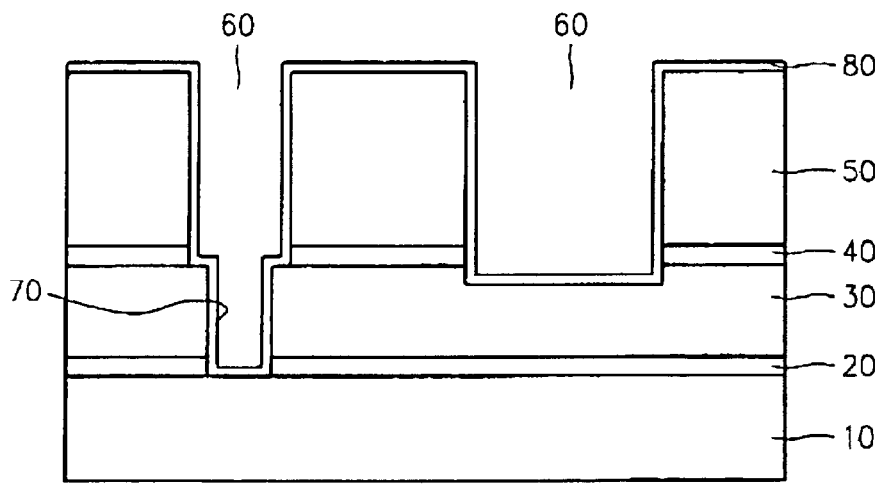
FIG. 3 illustrates a cross-sectional view of the semiconductor IC shown in FIG. 2, showing a barrier metal film being deposited on all exposed surfaces to prevent Cu diffusion.

Referring to FIG. 3, a representative barrier metal film 80 is deposited on all exposed surfaces to prevent Cu from diffusing through to insulating films 20, 30, 40, 50. The thickness of barrier metal film 80 may range between about 200 angstroms and about 1000 angstroms and is preferably about 450 angstroms. The barrier metal film 80 may consist of one or more films from the group consisting of Ta, TaN, TiN, TaSiN, TiSiN.

Figure 4:
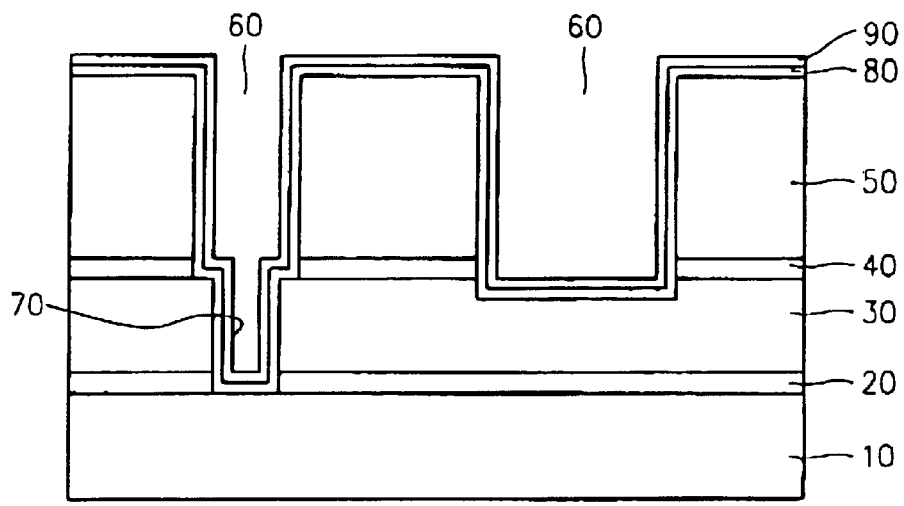
FIG. 4 illustrates a cross-sectional view of the semiconductor IC shown in FIG. 3, showing the deposition of a seed metal film on the barrier metal film preferably comprising Cu.

FIG. 4 illustrates the deposition of a seed metal film 90 preferably comprising Cu, which is deposited on the overall surface of barrier metal film 80. The thickness of seed metal film 90 may range between about 500 angstroms and about 2500 angstroms and is preferably about 1500 angstroms. The barrier metal film 80 and the seed metal film 90 are preferably deposited by sputtering, although a CVD process may be used.

Figure 5:
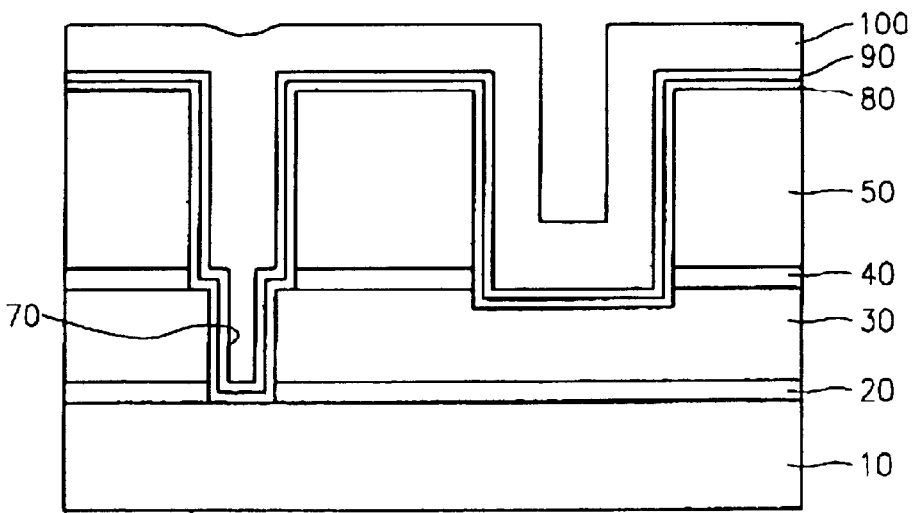
FIG. 5 illustrates a cross-sectional view of the semiconductor IC shown in FIG. 4, showing the deposition of a first electroplating copper film on the seed metal film.

FIG. 5 illustrates the deposition of a first electroplating film 100, which preferably comprises Cu and is deposited on the seed metal film 90. As may be seen in FIG. 5, the narrow and deep left cavity which includes via hole 70 is completely filled while wide and shallow right trench cavity 60 is, only partially filled during this first electroplating step. Specifically, in the first electroplating step, the first electroplating film 100 is preferably deposited to a minimum thickness to reduce the formation of stress-induced voids, while preferably filling the narrow and deep left cavity. The thickness of a Cu first electroplating film 100 in a representative example may be about 0.3 $\mu$m. In general, the width of the narrow and deep opening is preferably less than 0.6 $\mu$m, which can be adequately filled using a 0.3 $\mu$m thick deposition in the 1'st Cu electroplating process. More generally, an opening is completely filled by depositing Cu at a thickness of about a half of width of the opening.

Electroplating Cu film 100 is then annealed for a representative five minutes at about 200 degrees C. Such an annealing step is necessary to increase the grain size and thus reduce the resistivity of the Cu film 100, which is very high right after deposition due to the small size of the Cu grains employed in the first electroplating process. The time required for the annealing process is proportional to the annealing temperature. For example, at room temperature, a Cu film 100 having a thickness of about 1.2 $\mu$m would take approximately 4 days to reduce the surface resistance by 20%. Thus, it is desirable to use an annealing process that has an elevated temperature. However, elevating the annealing temperature above approximately 350 degrees C. introduces defects in the IC, such as the lifting of the oxide film.

Additionally, the degree of reduction in the resistivity is non-linear with layer thickness, annealing time, and temperature. For example, surface resistivity drops more than 15% when a Cu film 100 having a thickness of about 0.3 $\mu$m is annealed for about five minutes at about 200 degrees C., while such a resistivity reduction in a Cu film 100 having a thickness of 0.5 $\mu$m can be attained in about five minutes at 150 degrees C. For the preceding example, it is desirable to anneal the first Cu film 100 for about five minutes at about 200 degrees C. in the case of the present invention, which preferably uses about 0.3 $\mu$m Cu thickness in the first electroplating film 100. The resistivity will drop as the temperature increases until about 350 degrees C., after which the annealing effect is diminished. Thus, the annealing process may be conducted at about 350 degrees C. to obtain a more stable Cu film 100.

Figure 6:
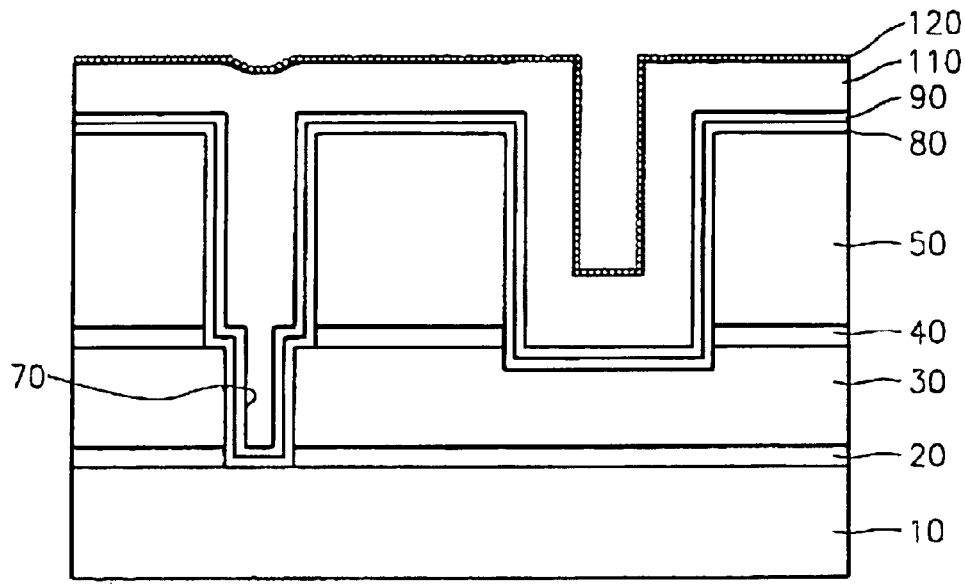
FIG. 6 illustrates a cross-sectional view of the semiconductor IC shown in FIG. 5, showing a resulting annealed Cu layer having a copper oxide film.
Figure 7:
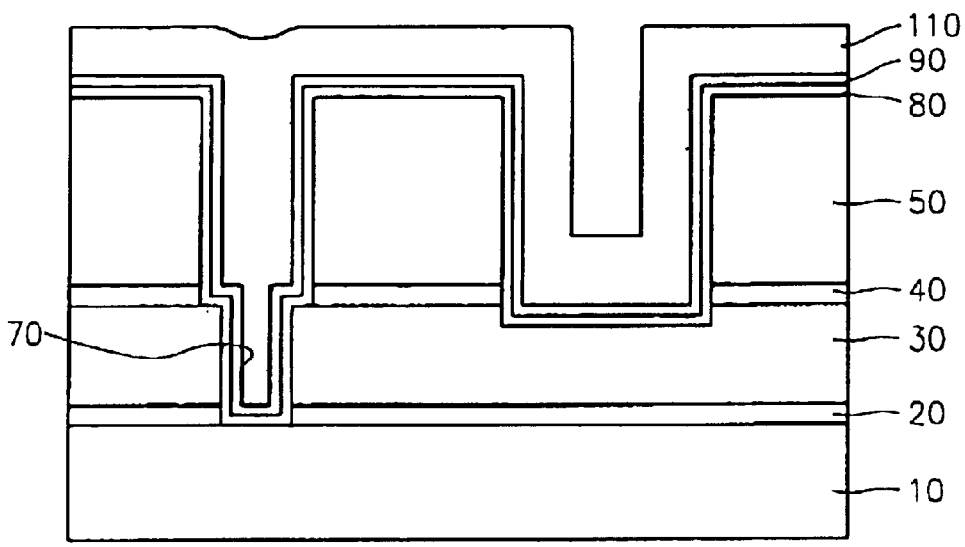
FIG. 7 illustrates a cross-sectional view of the semiconductor IC shown in FIG. 6, showing the IC after removal of the copper oxide film.

FIG. 6 illustrates a resulting annealed Cu layer 110. As a result of the elevated temperature of the preferred annealing process, however, an insulating thin oxide film of copper 120 forms on the surface of Cu layer 110. This copper oxide layer 120 must be removed before the second electroplating step, in order to insure proper adhesion and connectivity between first and second electroplated Cu layers. While the Cu oxide layer 120 can be etched and removed using RF with gas of Ar, He, H2 or a mixture thereof or a conventional 1% HF solution, a preferred removal method employs $H_2SO_4$, which is contained in the electroplating solution that is used in the copper electroplating (EP-Cu) process, producing the view as shown in FIG. 7. The latter process may comprise the step of placing the wafer in an electroplating solution for an exemplary 30 seconds without an electric current being applied, thereby dissolving the Cu oxide film 120 on the surface of Cu layer 110.

Figure 8:
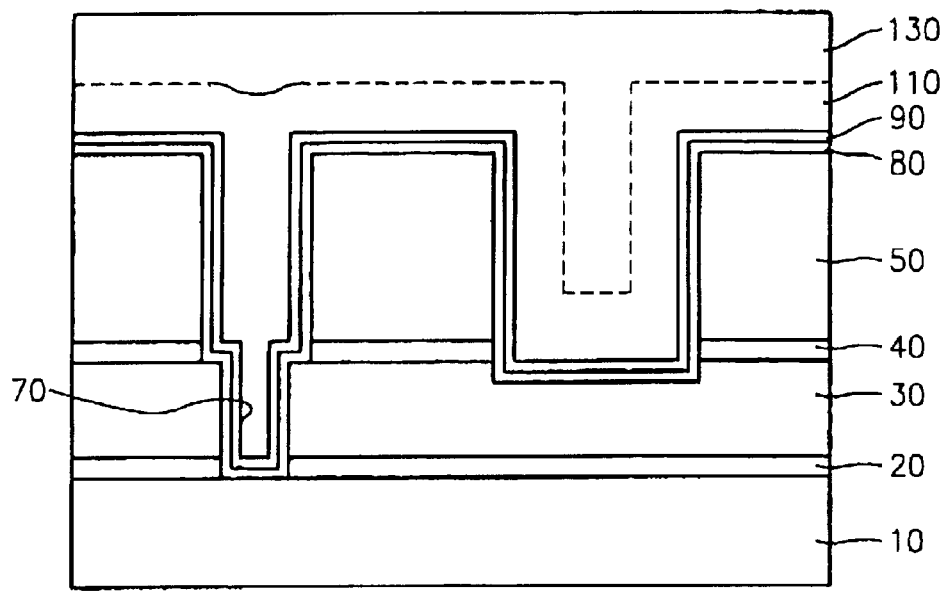
FIG. 8 illustrates a cross-sectional view of the semiconductor IC shown in FIG. 7, showing the IC after completion of a second Cu electroplating step.

FIG. 8 illustrates the IC after completion of a second Cu electroplating step, preferably using a thicker (large-grained) Cu material. In the second electroplating step, the wafer is placed in an electroplating solution and a second Cu layer 130 is deposited on first Cu layer 110. The second electroplating Cu film 130 preferably is deposited to a level that exceeds the depth of all trenches to be filled because a metal pattern which is formed in any region wider than 5 $\mu$m should be filled before performing a planarization process. An exemplary total thickness of electroplating Cu film 130 may be 1.4 $\mu$m for a trench depth of 1.2 $\mu$m.

The second electroplating Cu film 130 is preferably additionally deposited at a thickness of 1.1 $\mu$m since the first electroplating Cu film is deposited at a thickness of about 0.3 $\mu$m. It should be noted that second electroplating Cu deposition and the growth of Cu grain occur simultaneously. Therefore an electroplated Cu layer having only half as much stress as a normal process may be formed when adopting a double electroplating Cu process.

Figure 9:
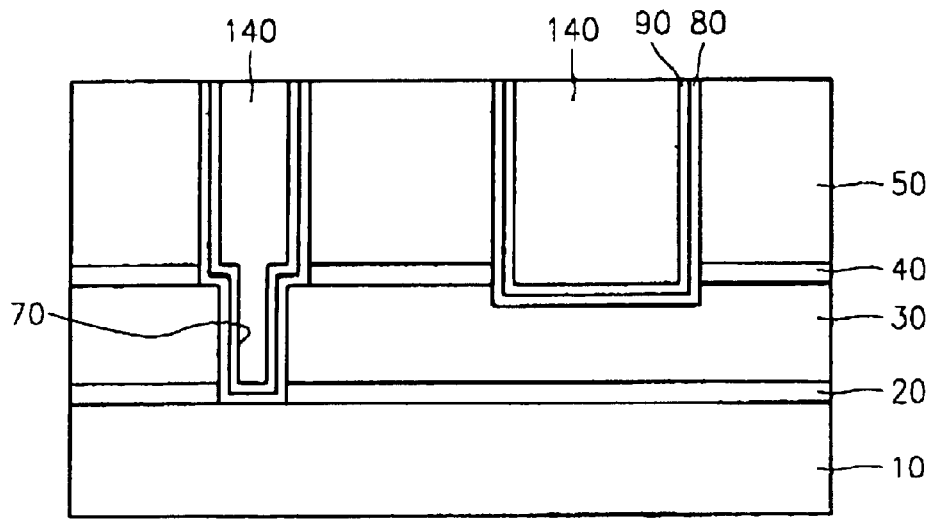
FIG. 9 illustrates a cross-sectional view of the semiconductor IC shown in FIG. 8, showing the IC after completion of a planarization/polishing to form the damascene interconnects.

FIG. 9 illustrates the IC after completion of a planarization/polishing to complete the formation of the damascene interconnects. By polishing the resulting IC preferably by CMP down to the surface of insulating layer 50, damascene interconnects 140 are formed.

The dual step process for the deposition of the copper provides a method for the rapid creation and annealment of a thin Cu layer that adheres well to the seed metal film 90, while simultaneously providing a compatible adhesive base for the deposition of a thicker overlaying Cu layer, that comprises the majority of the interconnection. In the foregoing, where the above description features an electroplating process, it can be appreciated that an electroless plating process may be used to obtain identical results.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of creating damascene interconnects having narrow and deep openings and wide and shallow openings in a semiconductor integrated device, comprising:
   A. depositing a plurality of layers on a semiconductor substrate to create an assembly having a top layer;
   B. forming a narrow and deep opening and a wide and shallow opening through at least two of the plurality of layers of the assembly;
   C. depositing a protective barrier film on exposed surfaces of the assembly;
   D. depositing a seed metal film on the protective barrier film;
   E. depositing a first metal film, such that the narrow and deep opening is completely filled;
   F. annealing the assembly having the first metal film;
   G. cleaning any metal oxide on the first metal film;
   H. depositing a second metal film on the first metal film such that the wide and shallow opening is completely filled; and immediately thereafter
   I. planarizing the assembly to the top layer of the assembly.

2. The method as claimed in claim 1, wherein the cleaning of the metal oxide on the first metal film is carried out by a reduction process using hydrogen-based plasma.

3. The method as claimed in claim 1, wherein the cleaning of the metal oxide on the first metal film is carried out by a chemical etching process.

4. The method as claimed in claim 3, wherein the chemical etching process is carried out using a chemical selected from the group consisting of inorganic acids and organic acids.

5. The method as claimed in claim 3, wherein the chemical etching process is carried out using a chemical selected from the group consisting of HF, H2SO4 and HCl.

6. The method as claimed in claim 1, wherein the first and second metal films are selected from the group consisting of copper film, gold film, and platinum film.

7. The method as claimed in claim 1, wherein in step F, the assembly is annealed at a temperature between about 150 to about 300 degrees Centigrade.

8. The method as claimed in claim 7, wherein the assembly is annealed for a period of time between about 3 minutes to about 30 minutes.

9. The method as claimed in claim 1, wherein the first metal film is deposited using an electroplating process.

10. The method as claimed in claim 1, wherein the first metal film is deposited using an electroless plating process.

11. The method as claimed in claim 1, wherein the second metal film is deposited using an electroplating process.

12. The method as claimed in claim 1, wherein the second metal film is deposited using an electroless plating process.

13. The method as claimed in claim 1, wherein the seed metal film is deposited using a CVD process or a sputtering process.

14. The method as claimed in claim 1, wherein the top layer of the assembly is planarized using a CMP process.

15. A method of creating damascene interconnects having narrow and deep openings and wide and shallow openings in a semiconductor integrated device, comprising:
   A. depositing a plurality of layers on a semiconductor substrate to create an assembly having a top layer;
   B. forming a narrow and deep opening and a wide and shallow opening through at least two of the plurality of layers of the assembly;
   C. depositing a protective barrier film on exposed surfaces of the assembly;
   D. depositing a seed metal film on the protective barrier film;
   E. depositing a first metal film by an electroplating process using a copper acid solution, such that the narrow and deep opening is completely filled;
   F. annealing the assembly having the first metal film;
   G. cleaning any metal oxide on the first metal film by a chemical etching process using the copper acid solution;
   H. depositing a second metal film such that the wide and shallow opening is completely filled by an electroplating process using the copper acid solution; and immediately thereafter
   I. planarizing the assembly to the top layer of the assembly.

16. The method as claimed in claim 15, wherein the copper acid solution contains HCl and H2SO4.

17. The method as claimed in claim 15, wherein the step of cleaning any metal oxide on the first metal film is conducted for a period of time between about 10 to about 60 seconds.

18. The method as claimed in claim 15, wherein steps G and H are conducted sequentially in a same treatment vessel.

19. The method as claimed in claim 15, wherein in step F, the assembly is annealed at a temperature between about 150 to about 300 degrees Centigrade.

20. The method as claimed in claim 19, wherein in step F, the assembly is annealed for a period of time between about 3 minutes to about 30 minutes.

21. The method as claimed in claim 15, wherein the seed metal film is deposited using a CVD process or a sputtering process.

22. The method as claimed in claim 15, wherein the top layer of the assembly is planarized using a CMP process.

* * * * *